United States Patent
Chen et al.

(10) Patent No.: US 8,912,564 B2
(45) Date of Patent: *Dec. 16, 2014

(54) LIGHT-EMITTING DEVICE

(71) Applicant: Epistar Corporation, Hsinchu (TW)

(72) Inventors: Yi-Ming Chen, Zhubei (TW);
Min-Hsun Hsieh, Hsinchu (TW);
Chia-Liang Hsu, Zhudong Township (TW)

(73) Assignee: Epistar Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/072,764

(22) Filed: Nov. 5, 2013

(65) Prior Publication Data

US 2014/0061708 A1 Mar. 6, 2014

Related U.S. Application Data

(63) Continuation of application No. 13/307,899, filed on Nov. 30, 2011, now Pat. No. 8,592,847.

(60) Provisional application No. 61/476,161, filed on Apr. 15, 2011.

(51) Int. Cl.
| | |
|---|---|
| H01L 33/00 | (2010.01) |
| H01L 33/08 | (2010.01) |
| H01L 33/40 | (2010.01) |
| H01L 33/38 | (2010.01) |
| H01L 33/62 | (2010.01) |
| H01L 33/10 | (2010.01) |
| H01L 33/44 | (2010.01) |

(52) U.S. Cl.
CPC ............. *H01L 33/08* (2013.01); *H01L 33/0079* (2013.01); *H01L 2924/0002* (2013.01); *H01L 33/405* (2013.01); *H01L 33/38* (2013.01); *H01L 33/44* (2013.01); *H01L 33/62* (2013.01); *H01L 33/10* (2013.01); *H01L 33/382* (2013.01)
USPC ...................................... 257/98; 257/E33.067

(58) Field of Classification Search
USPC .................................................... 257/E33.067
See application file for complete search history.

(56) References Cited

U.S. PATENT DOCUMENTS

| | | | |
|---|---|---|---|
| 6,614,056 B1 * | 9/2003 | Tarsa et al. ........................ | 257/91 |
| 6,693,296 B1 * | 2/2004 | Tyan ................................ | 257/40 |
| 6,828,596 B2 | 12/2004 | Steigerwald et al. | |
| 7,193,245 B2 | 3/2007 | Zhao et al. | |
| 7,329,905 B2 | 2/2008 | Ibbetson et al. | |
| 7,375,380 B2 * | 5/2008 | Asahara et al. ................. | 257/98 |
| 7,488,988 B2 | 2/2009 | Lin et al. | |
| 7,531,841 B2 | 5/2009 | Ko et al. | |

(Continued)

*Primary Examiner* — Lex Malsawma
(74) *Attorney, Agent, or Firm* — Patterson + Sheridan, LLP

(57) ABSTRACT

A light-emitting device includes a plurality of physically separated light-emitting units formed on a single substrate: a contact layer formed on a first side of the light-emitting units ; a first electrode formed on a second side of the light-emitting units: a conductive post formed between the first electrode and the contact layer; an electrical connection structure electrically connecting a first one of the light-emitting units with another a second one of the light-emitting units; a reflective layer formed between the first one of light-emitting units and the first electrode; a first conductive layer comprising a plurality of contacts formed between the first one of the light-emitting units and the reflective layer; and a second conductive layer formed between the reflective layer and the first conductive layer.

20 Claims, 13 Drawing Sheets

(56) References Cited

U.S. PATENT DOCUMENTS

| | | |
|---|---|---|
| 7,947,996 B2 | 5/2011 | Sakamoto et al. |
| 7,982,236 B2 | 7/2011 | Sano et al. |
| 8,120,057 B2 | 2/2012 | Sano et al. |
| 8,293,382 B2 | 10/2012 | Ou et al. |
| 8,536,590 B2 * | 9/2013 | Huang et al. .................. 257/88 |
| 8,592,847 B2 * | 11/2013 | Chen et al. .................. 257/98 |
| 2004/0206970 A1 | 10/2004 | Martin |
| 2005/0133807 A1 | 6/2005 | Park et al. |
| 2005/0212002 A1 | 9/2005 | Sanga et al. |
| 2006/0020585 A1 | 1/2006 | Harvey et al. |
| 2008/0251796 A1 * | 10/2008 | Lee et al. .................. 257/88 |
| 2009/0085048 A1 * | 4/2009 | Lee et al. .................. 257/89 |
| 2009/0108286 A1 | 4/2009 | Lin et al. |
| 2009/0134413 A1 * | 5/2009 | Roth et al. .................. 257/98 |
| 2009/0272971 A1 * | 11/2009 | Lee et al. .................. 257/43 |
| 2010/0006870 A1 * | 1/2010 | Lee et al. .................. 257/88 |
| 2010/0163887 A1 * | 7/2010 | Kim et al. .................. 257/76 |
| 2010/0265711 A1 * | 10/2010 | Lee .................. 362/249.06 |
| 2012/0126259 A1 * | 5/2012 | Mizutani et al. .................. 257/88 |
| 2012/0235158 A1 * | 9/2012 | Kim et al. .................. 257/76 |

* cited by examiner

LIGHT-EMITTING DEVICE

RELATED APPLICATION

This application is a continuation of U.S. patent application Ser. No. 13/307,899, entitled "Light Emitting Device", filed Nov. 30, 2011, which claims the benefit of provisional application No. 61/476,161 filed on Apr. 15, 2011; the contents of which are incorporated herein by reference in their entirety.

BACKGROUND

1. Technical Field

The present disclosure relates to a light-emitting device, and more particularly, to a light-emitting device having conductive posts.

2. Description of the Related Art

Light-emitting diodes (LEDs) have been applied widely to optical display devices, traffic signals, data storing devices, communication devices, illumination devices, and medical apparatuses. In the conventional LED, it includes an n-type semiconductor layer 4, an active layer 6, and a p-type semiconductor layer 8 sequentially formed on a substrate 2 in this order. A portion of the active layer 6 and the p-type semiconductor layer 8 are removed to expose a portion of the n-type semiconductor layer 4. A p-type electrode a1 and an n-type electrode a2 are formed on the p-type semiconductor layer 8 and the n-type semiconductor layer 4 respectively as FIG. 11 shows. Since the n-type electrode a2 needs to have sufficient area for sequential processes such as wire bonding, a significant part of the active layer 6 is removed and thereby decreasing the light-emitting efficiency.

SUMMARY OF THE DISCLOSURE

A light-emitting device includes a plurality of physically separated light-emitting units formed on a single substrate; a contact layer formed on a first side of the light-emitting units ; a first electrode formed on a second side of the light-emitting units; a conductive post formed between the first electrode and the contact layer; an electrical connection structure electrically connecting a first one of the light-emitting units with another a second one of the light-emitting units; a reflective layer formed between the first one of light-emitting units and the first electrode; a first conductive layer comprising a plurality of contacts formed between the first one of the light-emitting units and the reflective layer; and a second conductive layer formed between the reflective layer and the first conductive layer.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1A:
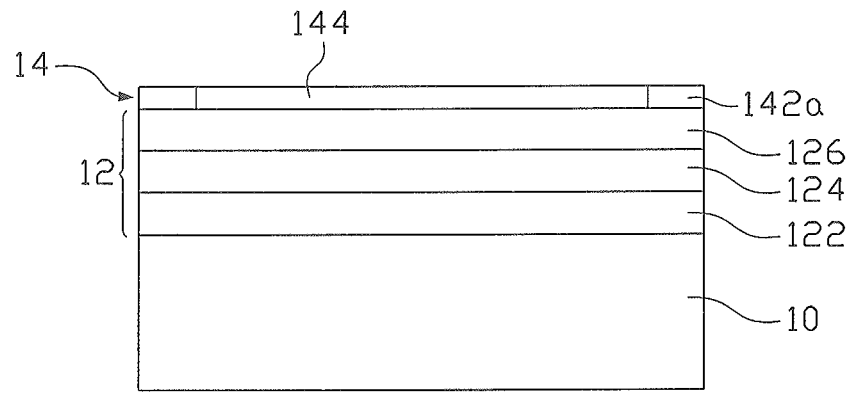
FIGS. 1A-1E illustrate flow charts of a manufacturing process of a light-emitting device in accordance with the first embodiment of the present application.
Figure 1B:
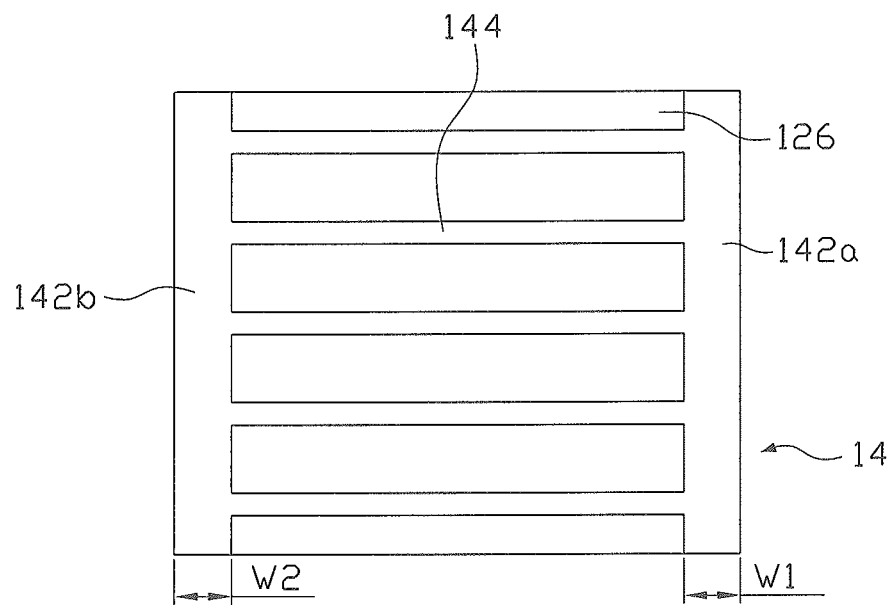
Figure 1C:
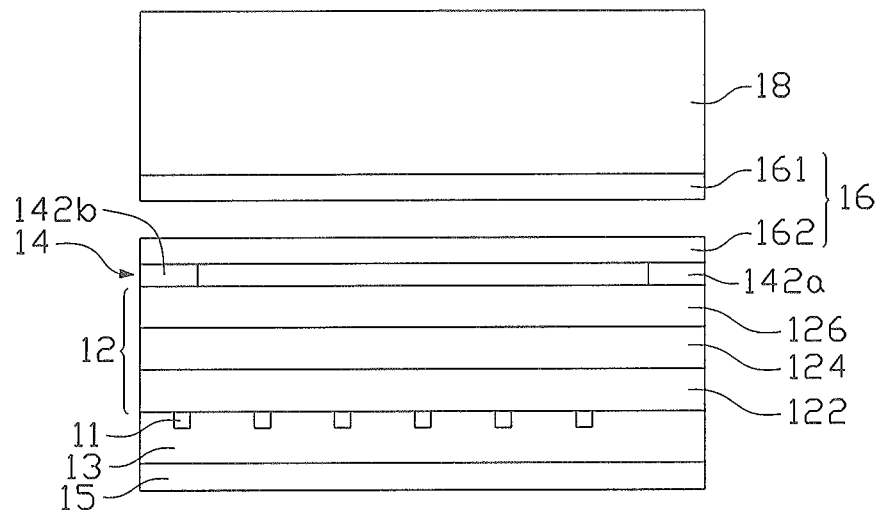
Figure 1D:
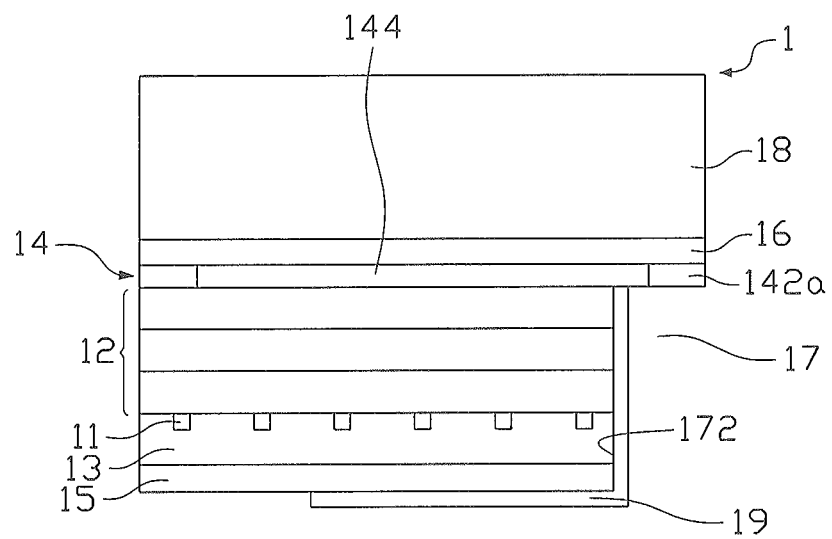
Figure 1E:
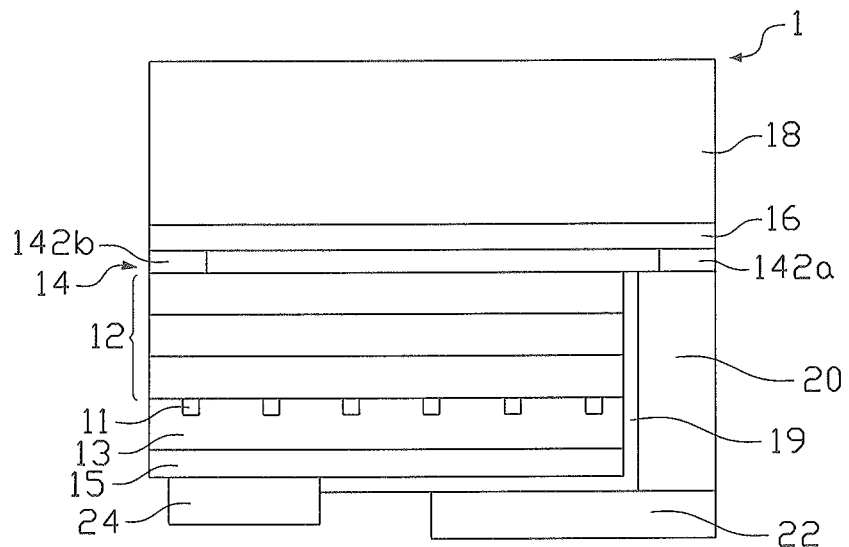
Figure 1F:
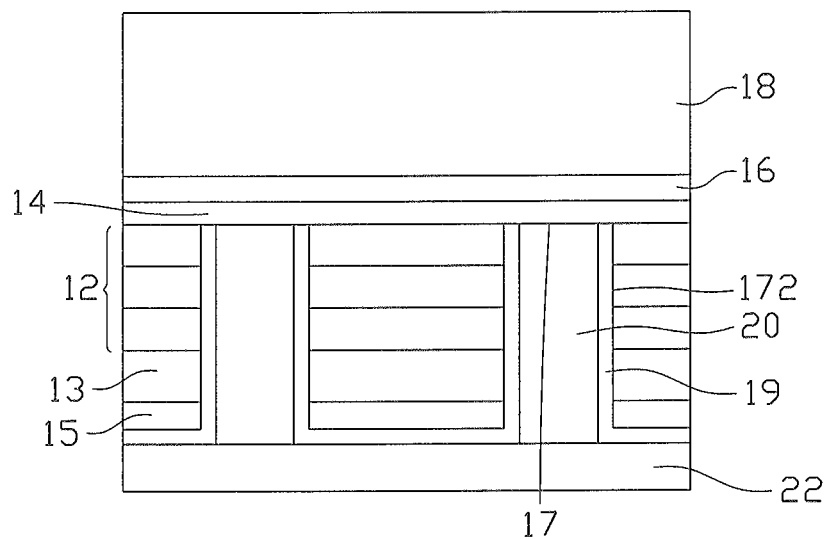
FIG. 1F illustrates a side view of the light-emitting device shown in FIG. 1E.

FIGS. 1A-1F disclose a light-emitting device 1 according to the first embodiment of the present disclosure. Referring to FIG. 1E, the light-emitting device 1 includes a support substrate 18; a bonding layer 16; a first contact layer 14; a light-emitting stacked layer 12; a first conductive layer 11; a second conductive layer 13; a reflective layer 15; a passivation layer 19; first conductive posts 20; a first electrode 22; and a second electrode 24. Referring to FIG. 1A, a method of manufacturing the light-emitting device 1 includes providing a growth substrate 10; forming a first semiconductor layer 122, an active layer 124, and a second semiconductor layer 126 sequentially on the growth substrate 10 to form the light-emitting stacked layer 12; and forming the first contact layer 14 on the light-emitting stacked layer 12. FIG. 1B shows a top view of FIG. 1A. As shown in FIG. 1B, the first contact layer 14 includes a first contact link 142a; a second contact link 142b; and a plurality of first contact lines 144 contacting the first contact link 142a and the second contact link 142b, and is patterned to expose a portion of the second semiconductor layer 126. The width w1 of the first contact link 142a for electrically connecting the first electrode 22 and contacting the first conductive posts 20 is larger than that w2 of the second contact link 142b. As shown in FIG. 1C, a bonding layer 16 comprises two sub-layers 161, 162 which are respectively formed on the first contact layer 14 and the support substrate 18. Subsequently, through a bonding process to bond the sub-layers 161, 162 together, the bonding layer 16 is formed to connect the support substrate 18 with the first contact layer 14 and the light-emitting stacked layer 12, wherein a portion of the bonding layer 16 is formed on the exposed second semiconductor layer 126. In other words, the support substrate 18 is bonded to the first contact layer 14 and the light-emitting stacked layer 12. Alternatively, the bonding layer 16 can merely be formed on one of the first contact layer 14 and the support substrate 18 for performing the bonding process. A first conductive layer 11 is formed on the first semiconductor layer 122 after removing the growth substrate 10, wherein the first conductive layer 11 includes a plurality of contact parts and exposes a portion of the first semiconductor layer 122. A second conductive layer 13 is formed on and surrounds the first conductive layer 11, wherein the second conductive layer 13 is formed on the exposed first semiconductor layer 122. Subsequently, a reflective layer 15 is formed on the second conductive layer 13 for reflecting the light emitted from the light-emitting stacked layer 12. As shown in FIG. 1D, portions of the reflective layer 15, the second conductive layer 13, the first conductive layer 11, and the light-emitting stacked layer 12 are removed to form a plurality of first recesses 17 and to expose portions of the first contact link 142a and/or the plurality of first contact lines 144. The passivation layer 19 is formed on a portion of the reflective layer 15 and extends along the inner walls 172 of the first recesses 17, and further cover portions of the first contact link 142a and/or the plurality of first contact lines 144. As shown in FIGS. 1E and 1F, the first conductive posts 20 are respectively formed in the first recesses 17 and touch the first contact link 142a and/or the plurality of first contact lines 144. The first electrode 22 is formed on the first conductive posts 20 and the passivation layer 19, wherein the first electrode 22 electrically connects with the first contact layer 14 by the conductive posts 20. The second electrode 24 is formed on portions of the reflective layer 15 which is not covered by the passivation layer 19 to form the light-emitting device 1. Because the plurality of first contact lines 144 are distributed on the second semiconductor layer 126 to increase the area for current to pass, the first contact layer 14 can improve the current spreading of the light-emitting device 1 to increase the light-emitting efficiency of the light-emitting device 1. For a conventional LED, a portion of the light-emitting stacked layer is provided for forming the first electrode thereon. Since the first electrode needs to have sufficient area for sequential processes such as wire bonding, a significant part of the active layer is removed and thereby decreasing the light-emitting efficiency. However, as the light-emitting device 1 exemplifies, less area of the active layer 124 is removed because the first electrode 22 connects with the first contact layer 14 by the first conductive posts 20 formed in the first recesses 17. The area of the first recesses 17 is much less than that of the first electrode 22. Therefore, the light-emitting efficiency of the light-emitting device 1 is not harmed because not too much active layer 124 is removed. Furthermore, the area of the first electrode 22 can also be increased so it is convenient for sequential processes compared to the conventional LED.

The support substrate 18 is transparent to the light emitted from the light-emitting stacked layer 12. The material of the support substrate 18 includes conductive material such as Diamond Like Carbon (DLC), composite materials, Metal Matrix Composite (MMC), Ceramic Matrix Composite (CMC), Polymer Matrix Composite (PMC), IP, SiC, GaP, GaAsP, InP, LiGaO$_2$, or LiAlO$_2$, or insulating material such as Sapphire, Diamond, Glass, Polymer, Epoxy, Quartz, Acryl, Al$_2$O$_3$, ZnO, or AlN.

The bonding layer 16 can adhesively connect the support substrate 18 with the first contact layer 14 or both the first contact layer 14 and light-emitting stacked layer 12, and be transparent to the light emitted from the light-emitting stacked layer 12. The bonding layer 16 can further includes a plurality of sub-layers. The material of the bonding layer 16 can be insulating material and/or conductive material. The insulating material includes but is not limited to polyimide, BCB, PFCB, MgO, Su8, Epoxy, Acrylic Resin, COC, PMMA, PET, PC, Polyetherimide, Fluorocarbon Polymer, Glass, Al$_2$O$_3$, SiO$_x$, TiO$_2$, SiN$_x$, or SOG. The conductive material includes but is not limited to ITO, InO, SnO, CTO, ATO, AZO, ZTO, ZnO, IZO, Ta$_2$O$_5$, DLC, GZO, and so on.

The first contact layer 14 can electrically conduct and spread current. The first contact layer 14 can be a conductive material which includes but is not limited to ITO, InO, SnO, CTO, ATO, AZO, ZTO, ZnO, GZO, IZO, Ta$_2$O$_5$, DLC, Cu, Al, In, Sn, Au, Pt, Zn, Ag, Ti, Ni, Pb, Pd, Ge, Ni, Cr, Cd, Co, Mn, Sb, Bi, Ga, Tl, Po, Ir, Re, Rh, Os, W, Li, Na, K, Be, Mg, Co, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on. The first contact link and the second contact link 142a and 142b are formed at the opposite edges of the light-emitting stacked layer 12 respectively. The width of the first contact link and the second contact link 142a and 142b is about 4~8 μm, preferably 6 μm. The width of each of the plurality of first contact lines 144 is about 3~10 μm. The distance between the two adjacent first contact lines 144 is about 70~140 μm. The ratio of the area of the second semiconductor layer 126 occupied by the plurality of first contact lines 144 to that of the second semiconductor layer 126 is about 4~30% for improving the light-emitting efficiency and the current spreading. The light-emitting stacked layer 12 can be grown on the growth substrate 10 and emit light. The polarities of the first semiconductor layer 122 and the second semiconductor layer 126 are different. A material of the light-emitting stacked layer 12 includes a semiconductor material containing more than one element selected from a group consisting of Ga, Al, In, As, P, N. Zn, Cd, and Se. The growth substrate 10 includes a material selected from a group consisting of Sapphire, GaAs, Si, GaN, and SiC.

The first conductive layer 11 can conduct and spread current and includes the plurality of contact parts or the plurality of contact lines. Each of the plurality of contact parts is separated from each other. To view from bottom, the shape of each of the plurality of contact parts can be triangle, rectangle, trapezoid, circle, and so on. The diameter of the circle contact part, for example, can be 3~15 μm, preferably 6~10 μm. The ratio of the area of the plurality of contact parts to the area of the top surface of the active layer 124 is about 0.5~6%, preferably 1~3%. The plurality of contact parts can be arranged into two or three lines between any two adjacent first contact lines 144 to improve current spreading. Namely, the plurality of first contact lines 144 is not located right above the plurality of contact parts. The second conductive layer 13 can cover and encompass the first conductive layer 11. Namely, the first conductive layer 11 is embedded in the second conductive layer 13. The second conductive layer 13 can conduct and spread current. The materials of the first conductive layer 11 and the second conductive layer 13 can be transparent conductive material and/or metal material. The transparent conductive material includes but is not limited to ITO, InO, SnO, CTO, ATO, AZO, ZTO, ZnO, GZO, IZO, Ta$_2$O$_5$, and DLC. The metal material includes but is not limited to Cu, Al, In, Sn, Au, Pt, Zn, Ag, Ti, Ni, Pb, Pd, Ge, Ni, Cr, Cd, Co, Mn, Sb, Bi, Ga, TI, Po, Ir, Re, Rh, Os, W, Li, Na, K. Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on. In addition, the second conductive layer 13 can be patterned or the thickness of the second conductive layer 13 can be adjusted so the reflective layer 15 can directly contact with the first conductive layer 11.

Figure 1G:
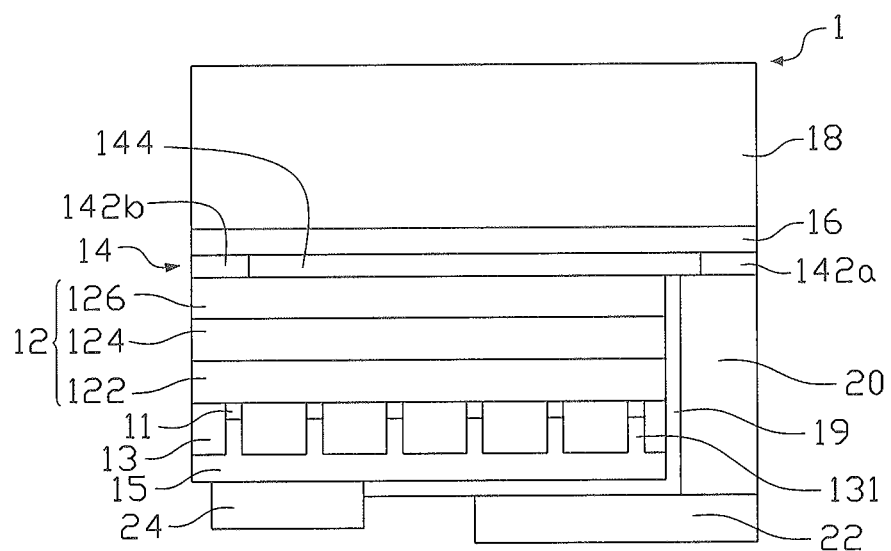
FIG. 1G illustrates a cross-sectional view of a light-emitting device in accordance with another embodiment of the present application.

Referring to FIG. 1G, the second conductive layer 13 has a plurality of channels 131 at the position corresponding to the first conductive layer 11. Subsequently, the reflective layer 15 is formed on the second conductive layer 13 and fills the channels 131 in the second conductive layer 13 to electrically connect with the first conductive layer 11 for improving the current spreading. In this embodiment, the material of the second conductive layer 13 can be insulating material which includes but is not limited to polyimide, BCB, PFCB, MgO, Su8, Epoxy, Acrylic Resin, COC, PMMA, PET, PC, Polyetherimide, Fluorocarbon Polymer, Glass, $Al_2O_3$, $SiO_x$, $TiO_2$, $SiN_x$, or SOG.

The reflective layer 15 can reflect the light emitted from the light-emitting stacked layer 12. The reflective layer 15 can further include a plurality of sub-layers (not shown) to form Distributed Bragg Reflector (DBR). The material of the reflective layer 15 can be transparent conductive material and/or metal material. The transparent conductive material includes but is not limited to ITO, InO, SnO, CTO, ATO, AZO, ZTO, ZnO, GZO, IZO, $Ta_2O_5$, and DLC. The metal material includes but is not limited to Cu, Al, In, Sn, Au, Pt, Zn, Ag, Ti, Ni, Pb, Pd, Ge, Ni, Cr, Cd, Co, Mn, Sb, Bi, Ga, Ti Po, Ir, Re, Rh, Os, W, Li, Na, K, Be, Mg, Co. Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on.

Referring to FIG. 1F, in this embodiment, the amount of the first recesses 17 is but not limited in two. Portions of the reflective layer 15, the conducting layer 13, the first conductive layer 11, and the light-emitting stacked layer 12 are exposed. In top view, the shape of the first recesses 17 can be triangle, rectangle, trapezoid, semicircle, and so on. The area of the active layer 124 for forming the first recesses 17 to that of the active layer 124 is about 4~20%. Less area of the active layer 124 is removed because the first electrode 22 connects with the first contact layer 14 by the first conductive posts 20 formed in the first recesses 17. The area of the first recesses 17 is much less than that of the first electrode 22. Therefore, the light-emitting efficiency of the light-emitting device 1 is not harmed because not too much active layer 124 is removed. The surfaces of the inner walls 172 can be rough surfaces for improving light extraction of the light-emitting device 1. The passivation layer 19 formed on the inner walls 172 of the first recesses 17 electrically isolates the first conductive posts 20 from the reflective layer 15, the second conductive layer 13, the first conductive layer 11, and the light-emitting stacked layer 12. The passivation layer 19 includes insulating material which includes but is not limited to polyimide, BCB, PFCB, MgO, Su8, Epoxy, Acrylic Resin, COC, PMMA, PET, PC, Polyetherimide, Fluorocarbon Polymer, Glass, $Al_2O_3$, $SiO_x$, $TiO_2$, $SiN_x$, or SOG.

The first conductive posts 20 are formed on the portion of the passivation layer 19 in the first recesses 17 and on the first contact link 142a and/or the plurality of first contact lines 144, and electrically connect with the first electrode 22 and the first contact layer 14. The material of the first conductive posts 20 can be transparent conductive material and/or metal material. When the refraction index of the conductive posts 20 is less than that of the passivation layer 19, the light extraction of the light-emitting device 1 can be improved because the refraction index from the light-emitting stacked layer 12 to the environment is gradually decreased. The transparent conductive material includes but is not limited to ITO, InO, SnO, CTO, ATO, AZO, ZTO, ZnO, GZO, IZO, $Ta_2O_5$, or DLC. The metal material includes but is not limited to Cu, Al, In, Sn, Au, Pt, Zn, Ag, Ti, Ni, Pb, Pd, Ge, Ni, Cr, Cd, Co, Mn, Sb, Bi, Ga, Tl, Po, Ir, Re, Rh, Os, W, Li, Na, K, Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on. The first and second electrodes 22 and 24 are for receiving external voltage. The materials of the first and second electrodes 22 and 24 can be transparent conductive material and/or metal material. The transparent conductive material includes but is not limited to ITO, InO, SnO, CTO, ATO, AZO, ZTO, ZnO, GZO, IZO, $Ta_2O_5$, and DLC. The metal material includes but is not limited to Cu, Al, In, Sn, Au, Pt, Zn, Ag, Ti, Ni, Pb, Pd, Ge, Ni, Cr, Cd, Co, Mn, Sb, Bi, Ga, TI, Po, Ir, Re, Rh, Os, W, Li, Na, K, Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on.

Figure 2A:
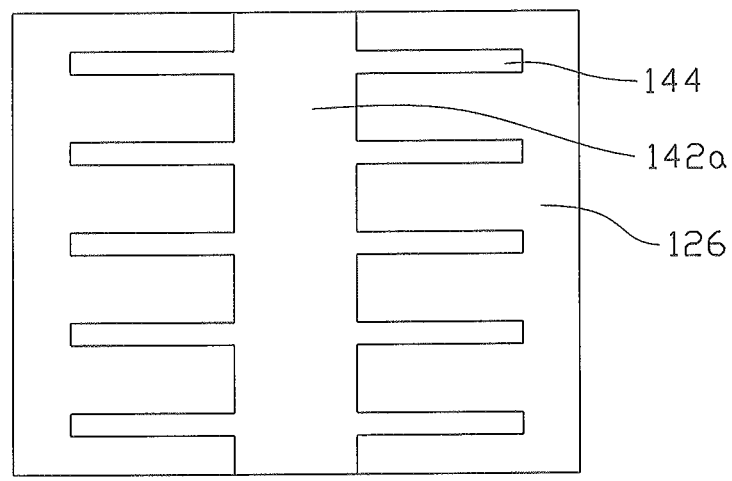
FIG. 2A illustrates a top view of a light-emitting device in accordance with the second embodiment of the present application.
Figure 2B:
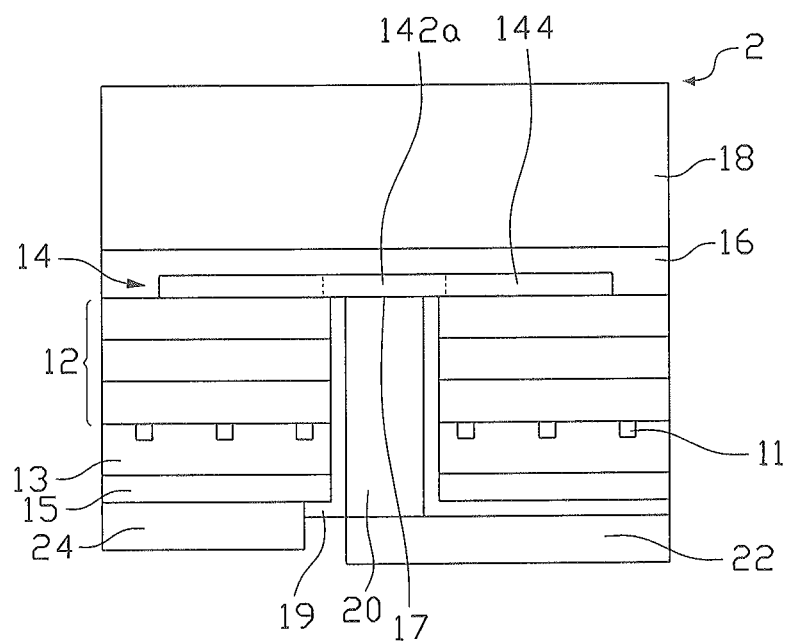
FIG. 2B illustrates a cross-sectional view of the light-emitting device shown in FIG. 2A.

FIGS. 2A-2B disclose a light-emitting device 2 according to the second embodiment of the present disclosure. Referring to FIG. 2B, the light-emitting device 2 includes a support substrate 18; a bonding layer 16; a first contact layer 14; a light-emitting stacked layer 12; a first conductive layer 11; a second conductive layer 13; a reflective layer 15; a passivation layer 19; first conductive posts 20; a first electrode 22; and a second electrode 24. The light-emitting device 2 is similar to the light-emitting device 1. However, the first contact link 142a is formed near a center of a top surface of the light-emitting stacked layer 12 and preferably along a central line of the light-emitting stacked layer 12, and the plurality of first contact lines 144 extends from the first contact link 142a toward the edges of the light-emitting stacked layer 12 in the second embodiment. The first recesses 17 are formed near the center of the top surface of the light-emitting stacked layer 12, and the first conductive posts 20 are formed in the first recesses 17 to electrically connect the first electrode 22 and the first contact layer 14. Because the plurality of first contact lines 144 is distributed on the second semiconductor layer 126 to increase the area for current to pass, the first contact layer 14 can improve the current spreading of the light-emitting device 1 to increase the light-emitting efficiency of the light-emitting device 1. For a conventional LED, a portion of the light-emitting stacked layer is provided for forming the first electrode thereon. Since the first electrode needs to have sufficient area for sequential processes, such as wire bonding, a significant part of the active layer is removed, and thereby decreasing the light-emitting efficiency. However, as the light-emitting device 2 exemplifies, less of the active layer 124 is removed because the first electrode 22 connects with the first contact layer 14 by the first conductive posts 20 formed in the first recesses 17. The area of the first recesses 17 is much less than that of the first electrode 22. Therefore, the light-emitting efficiency of the light-emitting device 2 is not harmed because not too much active layer 124 is removed. Furthermore, the area of the first electrode 22 can also be increased so it is convenient for sequential processes compared to the conventional LED.

Figure 3:
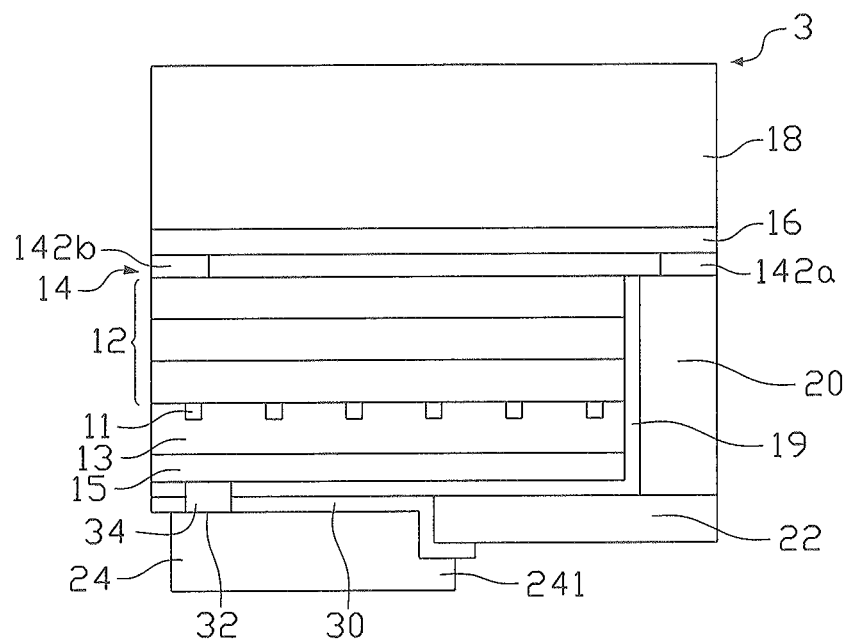
FIG. 3 illustrates a cross-sectional view of a light-emitting device in accordance with the third embodiment of the present application.

FIG. 3 discloses a light-emitting device 3 according to the third embodiment of the present disclosure. Referring to FIG. 3, the light-emitting device 3 includes a support substrate 18; a bonding layer 16; a first contact layer 14; a light-emitting stacked layer 12; a first conductive layer 11; a second conductive layer 13; a reflective layer 15; a passivation layer 19;

first conductive posts 20; a first electrode 22; and a second electrode 24. The light-emitting device 3 is similar to the light-emitting device 1. In addition, the passivation layer 19 is formed on and covers entire top surface of the reflective layer 15. An insulating layer 30 is formed on the passivation layer 19 and the first electrode 22. The second electrode 24 is formed on the insulating layer 30, wherein a portion of the second electrode 24 is over the first electrode 22. There are through holes 32 formed in the insulation layer 30 and the passivation layer 19, and second conductive posts 34 formed therein to electrically connect the second electrode 24 and the reflective layer 15. Because the insulating layer 30 can electrically isolate the first electrode 22 from the second electrode 24, the second electrode 24 can be formed to have a portion 241 over the first electrode 22. Therefore, it is convenient for sequential processes. The insulating layer 30 includes insulating material which includes but is not limited to polyimide, BCB, PFCB, MgO, Su8, Epoxy, Acrylic Resin, COC, PMMA, PET, PC, Polyetherimide, Fluorocarbon Polymer, Glass, $Al_2O_3$, $SiO_x$, $TiO_2$, $SiN_x$, or SOG. The material of the second conductive posts 34 can be transparent conductive material and/or metal material. The transparent conductive material includes but is not limited to ITO, InO, SnO, CTO, ATO, AZO, ZTO, ZnO, GZO, IZO, $Ta_2O_5$, or DLC. The metal material includes but is not limited to Cu, Al, In, Sn, Au, Pt, Zn, Ag, Ti, Ni, Pb, Pd, Ge, Ni, Cr, Cd, Co, Mn, Sb, Bi, Ga, TI, Po, Ir, Re, Rh, Os, W, Li, Na, K, Be, Mg, Ca, Sr, Ba, Zr, Mo, La, Cr—Au, Cu—Sn, Cu—Zn, Cu—Cd, Sn—Pb—Sb, Sn—Pb—Zn, Ni—Sn, Ni—Co, Au alloy, and so on.

Figure 4:
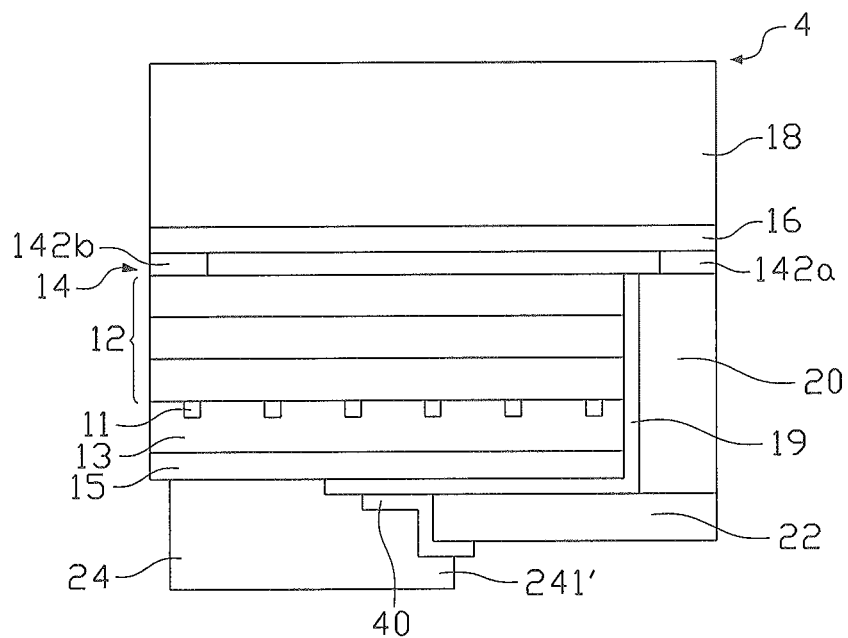
FIG. 4 illustrates a cross-sectional view of a light-emitting device in accordance with the forth embodiment of the present application.

FIG. 4 discloses a light-emitting device 4 according to the forth embodiment of the present disclosure. Referring to FIG. 4, the light-emitting device 4 includes a support substrate 18; a bonding layer 16; a first contact layer 14; a light-emitting stacked layer 12; a first conductive layer 11; a second conductive layer 13; a reflective layer 15; a passivation layer 19; first conductive posts 20; a first electrode 22; and a second electrode 24. The light-emitting device 4 is similar to the light-emitting device 1. In addition, an insulating layer 40 is formed on the passivation layer 19 and the first electrode 22, and the second electrode 24 is formed on the reflective layer 15, the passivation layer 19, and the insulating layer 40, wherein the insulating layer 40 electrically isolates the first electrode 22 from the second electrode 24 and a portion of the second electrode 24 is over the first electrode 22. The second electrode 24 is electrically connected with the reflective layer 15. Because the insulating layer 40 can electrically isolate the first electrode 22 from the second electrode 24, the second electrode 24 can be formed to have a portion 241' over the first electrode 22. Therefore, it is convenient for sequential processes.

Figure 5:
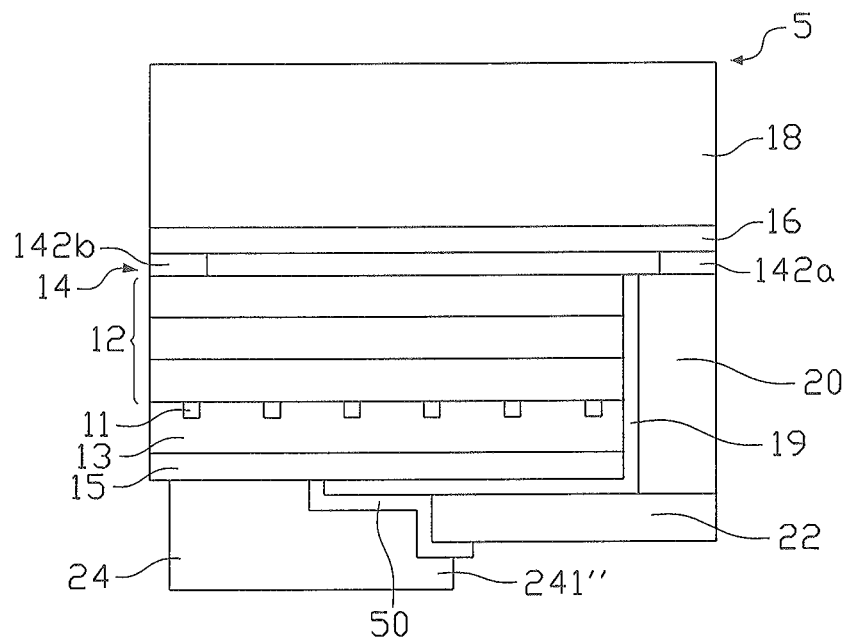
FIG. 5 illustrates a cross-sectional view of a light-emitting device in accordance with the fifth embodiment of the present application.

FIG. 5 discloses a light-emitting device 5 according to the fifth embodiment of the present disclosure. Referring to FIG. 5, the light-emitting device 5 includes a support substrate 18; a bonding layer 16; a first contact layer 14; a light-emitting stacked layer 12; a first conductive layer 11; a second conductive layer 13; a reflective layer 15; a passivation layer 19; first conductive posts 20; a first electrode 22; and a second electrode 24. The light-emitting device 5 is similar to the light-emitting device 1. In addition, an insulating layer 50 is formed on the reflective layer 15, the passivation layer 19 and the first electrode 22, and the second electrode 24 is formed on the reflective layer 15, the passivation layer 19, and the insulating layer 50, wherein the insulating layer 50 electrically isolates the first electrode 22 from the second electrode 24 and a portion of the second electrode 24 is over the first electrode 22. The second electrode 24 is electrically connected with the reflective layer 15. Because the insulating layer 50 can electrically isolate the first electrode 22 from the second electrode 24, the second electrode 24 can be formed to have a portion 241" over the first electrode 22. Therefore, it is convenient for sequential processes.

Figure 6:
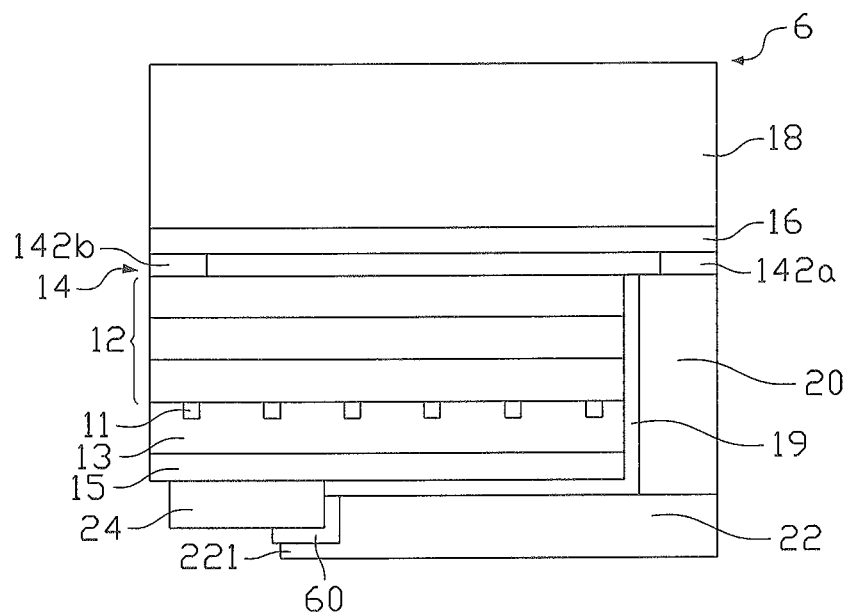
FIG. 6 illustrates a cross-sectional view of a light-emitting device in accordance with the sixth embodiment of the present application.

FIG. 6 discloses a light-emitting device 6 according to the sixth embodiment of the present disclosure. Referring to FIG. 6, the light-emitting device 6 includes a support substrate 18; a bonding layer 16; a first contact layer 14; a light-emitting stacked layer 12; a first conductive layer 11; a second conductive layer 13; a reflective layer 15; a passivation layer 19; first conductive posts 20; a first electrode 22; and a second electrode 24. The light-emitting device 6 is similar to the light-emitting device 1. In addition, an insulating layer 60 is formed on the passivation layer 19 and the second electrode 24, and the first electrode 22 is formed on the first conductive post 20, the passivation layer 19, and the insulating layer 60, wherein the insulating layer 60 electrically isolates the first electrode 22 from the second electrode 24 and a portion of the first electrode 22 is over the second electrode 24. The first electrode 22 is electrically connected with the first contact layer 14. Because the insulating layer 60 can electrically isolate the first electrode 22 from the second electrode 24, the first electrode 22 can be formed to have a portion 221 over the second electrode 24. Therefore, it is convenient for sequential processes.

Figure 7:
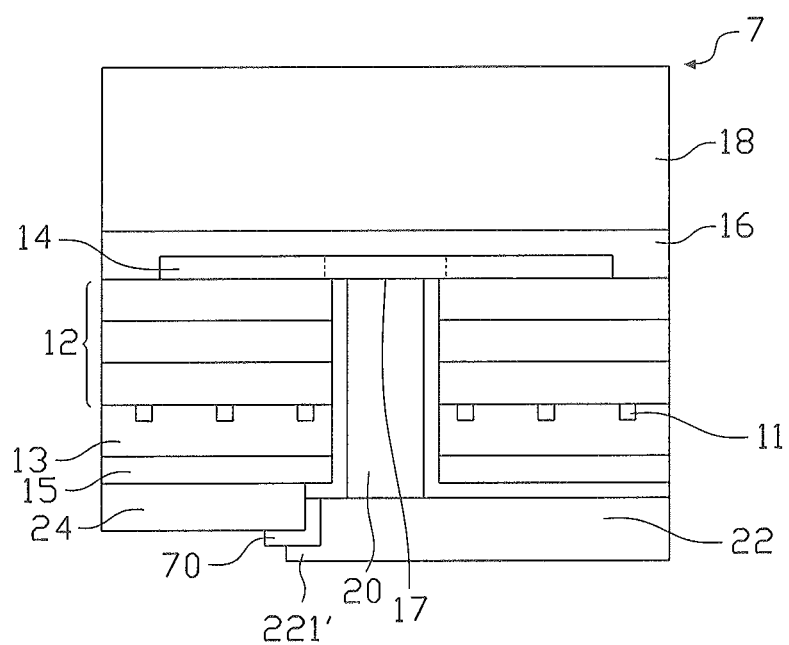
FIG. 7 illustrates a cross-sectional view of a light-emitting device in accordance with the seventh embodiment of the present application.

FIG. 7 discloses a light-emitting device 7 according to the seventh embodiment of the present disclosure. Referring to FIG. 7, the light-emitting device 7 includes a support substrate 18; a bonding layer 16; a first contact layer 14; a light-emitting stacked layer 12; a first conductive layer 11; a second conductive layer 13; a reflective layer 15; a passivation layer 19; first conductive posts 20; a first electrode 22; and a second electrode 24. The light-emitting device 7 is similar to the light-emitting device 2. In addition, an insulating layer 70 is formed on the passivation layer 19 and the second electrode 24, and the first electrode 22 is formed on the first conductive posts 20, the passivation layer 19, and the insulating layer 70, wherein the insulating layer 70 electrically isolates the first electrode 22 from the second electrode 24 and a portion of the first electrode 22 is over the second electrode 24. The first electrode 22 is electrically connected with the first contact layer 14. Because the insulating layer 70 can electrically isolate the first electrode 22 from the second electrode 24, the first electrode 22 can be formed to have a portion 221' over the second electrode 24. Therefore, it is convenient for sequential processes.

Figure 8A:
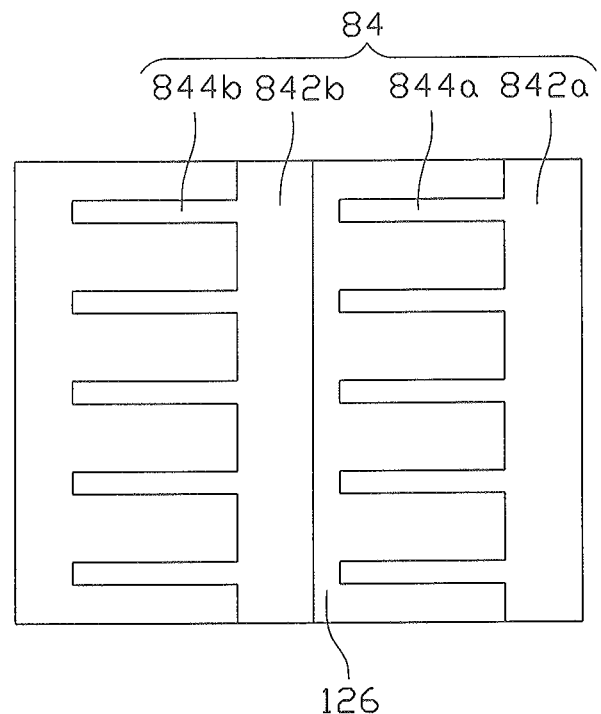
FIG. 8A illustrates a top view of a light-emitting device in accordance with the eighth embodiment of the present application.
Figure 8B:
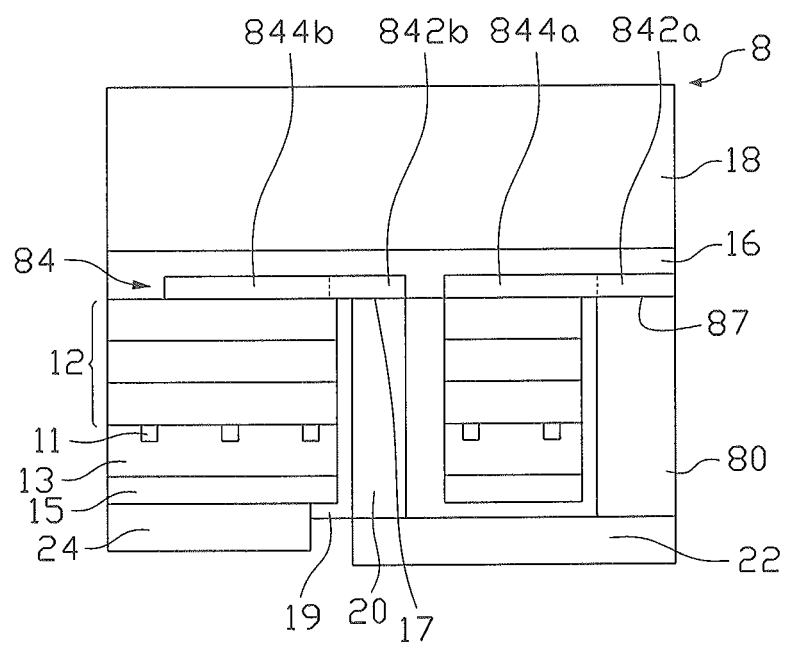
FIG. 8B illustrates a cross-sectional view of the light-emitting device shown in FIG. 8A.

FIGS. 8A and 8B disclose a light-emitting device 8 according to the eighth embodiment of the present disclosure. Referring to FIGS. 8A and 8B, the light-emitting device 8 includes a support substrate 18; a bonding layer 16; a first contact layer 84; a light-emitting stacked layer 12; a first conductive layer 11; a second conductive layer 13; a reflective layer 15; a passivation layer 19; a first conductive post 20; a second conductive post 80; a first electrode 22; and a second electrode 24. The light-emitting device 8 is similar to the light-emitting device 2. However, the first contact layer 84 includes a first contact link 842a and a second contact link 842b. The second contact link 842b is formed near the center of the top surface of the light-emitting stacked layer 12 and preferably along the central line of the light-emitting stacked layer 12. The first contact layer 84 further includes a plurality of first contact lines 844a which is connected with the first contact link 842a and extends from the first contact link 842a toward the central line of the light-emitting stacked layer 12, and a plurality of second contact lines 844b which is connected with the second contact link 842b and extends from the second contact link 842b toward the edge of the light-emitting stacked layer 12. A first recess 17 and a second recess 87 are respectively formed near the center of the top surface of the light-emitting stacked layer 12 and the edge of the light-emitting device 8. The first conductive post 20 is formed in the first recess 17 and the second conductive post 80 is formed in the second recess 87 to electrically connect the first electrode 22 and the first contact layer 84.

FIGS. 9A to 9D disclose a light-emitting device 9 according to the ninth embodiment of the present disclosure. In this embodiment, in order to enlarge the total effective lighting area of the light-emitting device 9, the formation of the first recess 17 is avoided. That is, the portions of the reflective layer 15 and the light-emitting stacked layer 12 which were originally removed to form a first recess 17 are remained. Instead, an electrical connection structure 99 is extended from outside of the light-emitting stacked layer 12 via the air-bridge manufacturing method.

Figure 9A:
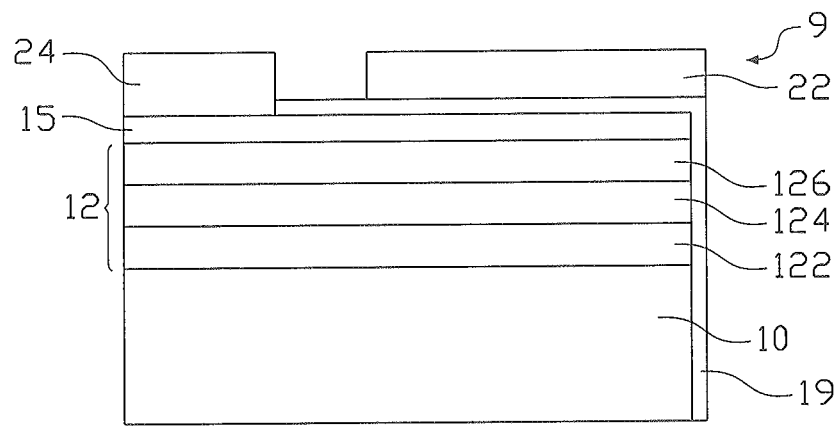
FIGS. 9A-9C illustrate flow charts of a manufacturing process of a light-emitting device in accordance with the ninth embodiment of the present application.
Figure 9B:
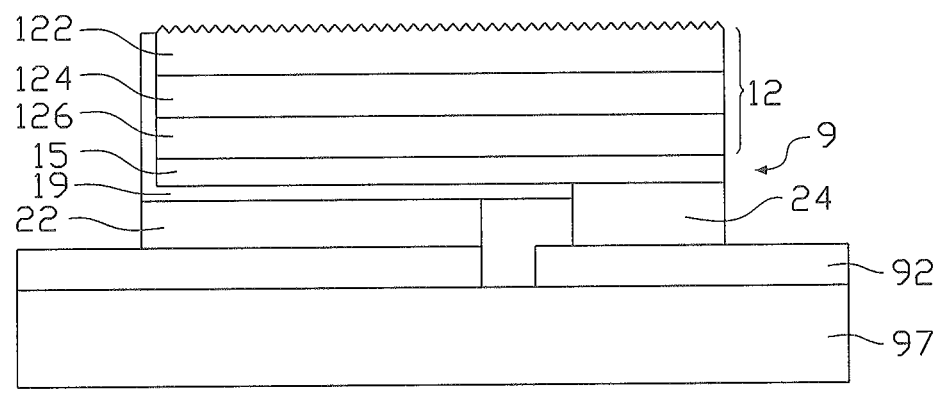
Figure 9C:
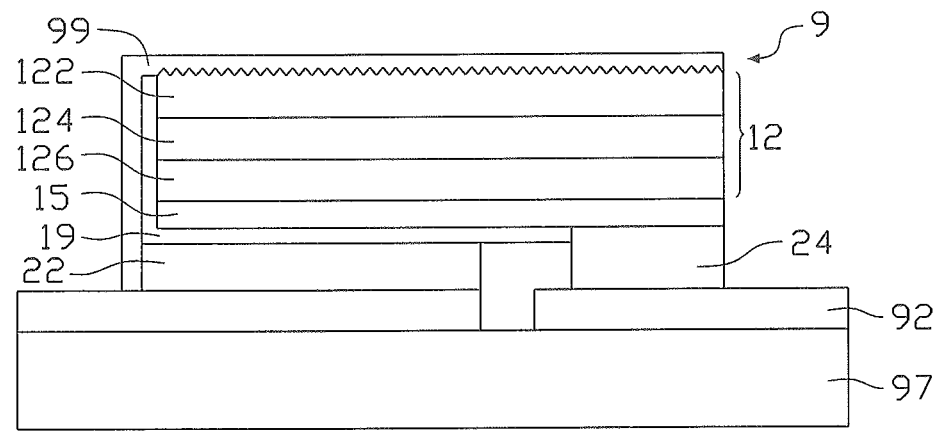

As shown in FIG. 9A, a method of manufacturing the light-emitting device 9 includes providing a growth substrate 10; forming a first semiconductor layer 122, an active layer 124, and a second semiconductor layer 126 sequentially on the growth substrate 10 to form the light-emitting stacked layer 12; forming a reflective layer 15 on the light-emitting stacked layer 12; forming a second electrode 24 on the reflective layer 15; a passivation layer 19 is then formed on a portion of the reflective layer 15 and extends along the side wall of the light-emitting stacked layer 12; and a first electrode 22 is formed on the passivation layer 19. Then, as shown in FIG. 9B, the light-emitting device 9 is flipped on a submount 97 where conductive traces 92 are formed. After bonding the electrodes 22 and 24 of the light-emitting device 9 and the conductive traces 92 on the submount 97, the growth substrate 10 is removed and the surface of the first semiconductor layer 122 is roughened to enhance the light extraction efficiency. As shown in FIG. 9C, then, the electrical connection structure 99 for electrically connecting the first semiconductor layer 122 and the first electrode 22 is formed on the first semiconductor layer 122 and along the side wall of the light-emitting stacked layer 12. Besides, the conductive traces 92 on the submount 97 could be optionally extended for wire bonding the light-emitting device 9 to the external electrical circuit.

Figure 9D:
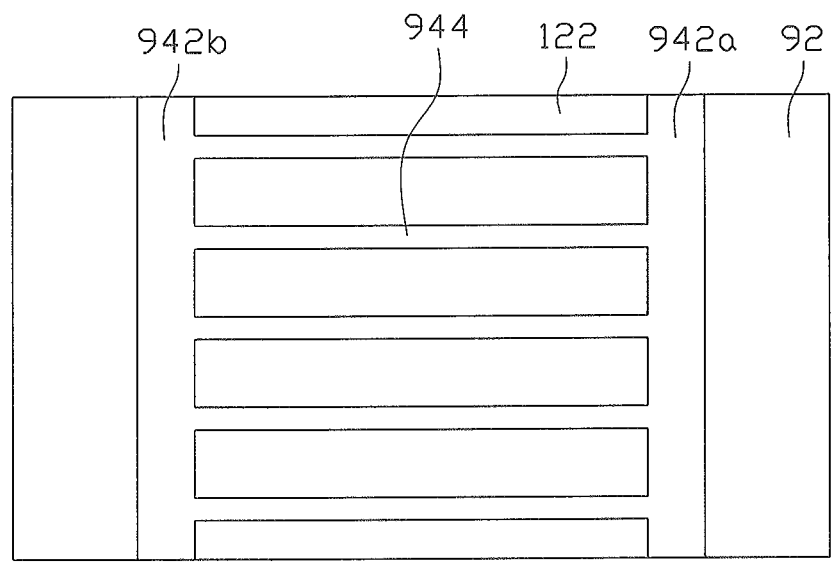
FIG. 9D illustrates a top view of the light-emitting device shown in FIG. 9C.

FIG. 9D discloses the top view of the light-emitting device 9, the electrical connection structure 99 includes contact links 942a and 942b and a plurality of first contact lines 944 on the light-emitting stacked layer 12. The extended conductive traces 92 are electrically connected to the external electric circuit through wire bonding.

Figure 10:
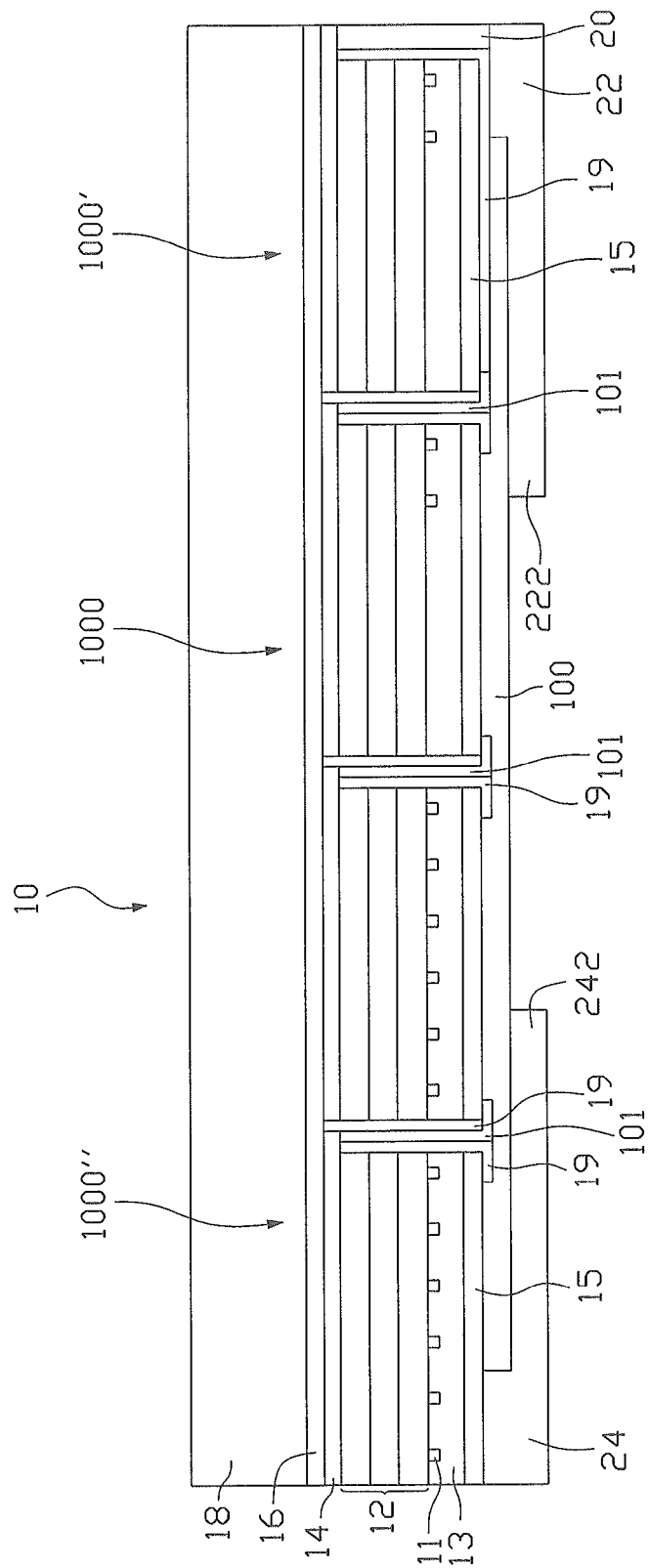
FIG. 10 illustrates a cross-sectional view of a light-emitting device in accordance with the tenth embodiment of the present application.
Figure 11:
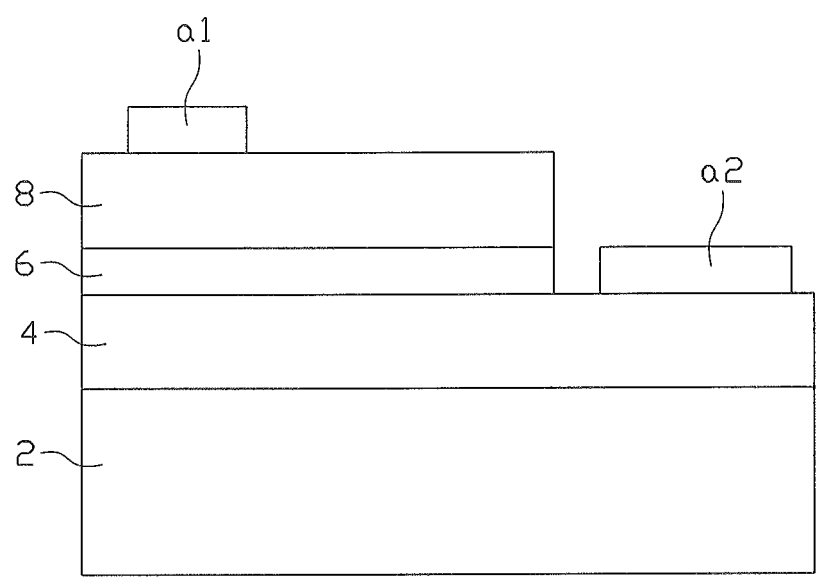
FIG. 11 illustrates a cross-sectional view of a conventional LED.

FIG. 10 discloses a light-emitting device 10 according to the tenth embodiment of the present disclosure. The light-emitting device 10 includes a plurality of light-emitting units 1000. Each of the light-emitting units 1000 is similar to the light-emitting device 1 and includes a first contact layer 14; a light-emitting stacked layer 12; a first conductive layer 11; a second conductive layer 13; and a reflective layer 15. The light-emitting device 10 further includes an electrical connection structure 101 for electrically connecting two adjacent light-emitting units 1000 such that the light-emitting units 1000 are electrically connected in series with each other. Specifically, the electrical connection structure 101 electrically connects the first contact layer 14 of one of the light-emitting units 1000 to the reflective layer 15 of adjacent one of the light-emitting units 1000. Alternatively, each of the light-emitting unit can include a plurality of light-emitting diodes which are connected with each other in series, in parallel or in anti-parallel connections. A passivation layer 19 is formed between each light-emitting unit 1000 and the electrical connection structure 101 for preventing undesired current path therebetween. In addition, an insulating layer 100 is formed on portions of the passivation layer 19 and the reflective layer 15 in each light-emitting unit 1000. Furthermore, a first light-emitting unit 1000' includes first conductive posts 20 for electrically connect the first contact layer 14 with a first electrode 22. The first electrode 22 is further formed on the insulating layer 100 and the passivation layer 19 of the first light-emitting units 1000'. A second electrode 24 is formed on the passivation layer 19 and the reflective layer 15 of a second light-emitting unit 1000". The first conductive posts 20 have a width equal to or larger than that of the electrical connection structure 101. The light-emitting units 1000 are commonly bonded to a support substrate 18 through a bonding layer 16. By virtues of the insulating layer 100 which electrically isolates the first electrode 22 from the second electrode 24, the first electrode 22 and the second electrode 24 can have portions 222 and 242. Therefore, it is convenient for sequential processes.

In another embodiment, a photovoltaic device can include a structure similar to one of the aforementioned light-emitting devices for receiving light. The area of the first electrode 22 can be increased so it is convenient for sequential processes compared to the conventional photovoltaic device and heat dissipation is improved.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a plurality of physically separated light-emitting units formed on a single substrate;
   a contact layer formed on a first side of the light-emitting units;
   a first electrode formed on a second side of the light-emitting units;
   a conductive post formed between the first electrode and the contact layer;
   an electrical connection structure electrically connecting a first one of the light-emitting units with a second one of the light-emitting units;
   a reflective layer formed between the first one of light-emitting units and the first electrode;
   a first conductive layer comprising a plurality of contacts formed between the first one of the light-emitting units and the reflective layer; and
   a second conductive layer formed between the reflective layer and the first conductive layer.

2. The light-emitting device of claim 1, further comprising a passivation layer formed between the conductive post and one of the light-emitting units.

3. The light-emitting device of claim 1, wherein the contact layer contacts with the first one of the light-emitting units and the first electrode contacts with the second one of the light-emitting units.

4. The light-emitting device of claim 1, further comprising an insulating layer formed between the electrical connection structure and the first electrode.

5. The light-emitting device of claim 1, wherein the reflective layer is formed between the electrical connection structure and the first one of the light-emitting units.

6. The light-emitting device of claim 1, wherein a width of the conductive post is larger than that of the electrical connection structure.

7. The light-emitting device of claim 1, further comprising:
a second electrode formed on the second side of the light-emitting units and separated from the first electrode; and
an insulating layer formed between the second electrode and the light-emitting units,
wherein each of the light-emitting units comprise the reflective layer, and one of the reflective layer contacts the second electrode.

8. The light-emitting device of claim 1, further comprising:
a support substrate formed on the first side of the light-emitting units; and
a bonding layer formed between the support substrate and the contact layer.

9. The light-emitting device of claim 8, wherein the bonding layer comprises at least one of insulating material and conductive material.

10. The light-emitting device of claim 1, wherein the contact layer comprises a first contact link and a plurality of first contact lines connected with the first contact link.

11. The light-emitting device of claim 10, wherein a distance between two adjacent first contact lines is between 3 μm and 10 μm.

12. The light-emitting device of claim 11, wherein the contact layer comprises a second contact link connected with a portion of the plurality of first contact lines where is devoid of contacting the first contact link, wherein the width of the first contact link is wider than that of the second contact link.

13. The light-emitting device of claim 10, wherein an area of one of the light-emitting units occupied by the plurality of first contact lines is 4% to 30% of the total surface area of the one of the light-emitting units.

14. The light-emitting device of claim 10, wherein the plurality of first contact lines extends from the first contact link toward an edge of the light-emitting units.

15. The light-emitting device of claim 10, wherein the contact layer comprises:
a second contact link separated from the first contact link; and
a plurality of second contact lines contacting the second contact link, separated from the plurality of first contact lines.

16. The light-emitting device of claim 1, wherein the conductive post comprises a side exposed to the environment.

17. The light-emitting device of claim 1, wherein the conductive post contacts the first electrode and the contact layer.

18. The light-emitting device of claim 1, wherein
the second conductive layer comprises a plurality of channels, the first conductive layer contacts the reflective layer in the plurality of channels.

19. The light-emitting device of claim 1, wherein each of the light-emitting units comprises the contact layer and the contact layers are physically separated.

20. The light-emitting device of claim 1, wherein the plurality of contacts layer comprises at least one of a contact part and a contact line.

* * * * *